United States Patent
Lin et al.

(10) Patent No.: US 9,230,901 B2
(45) Date of Patent: Jan. 5, 2016

(54) SEMICONDUCTOR DEVICE HAVING CHIP EMBEDDED IN HEAT SPREADER AND ELECTRICALLY CONNECTED TO INTERPOSER AND METHOD OF MANUFACTURING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 0 days.

(21) Appl. No.: 14/625,354

(22) Filed: Feb. 18, 2015

(65) Prior Publication Data

US 2015/0235935 A1    Aug. 20, 2015

Related U.S. Application Data

(60) Provisional application No. 61/941,656, filed on Feb. 19, 2014.

(51) Int. Cl.

| | |
|---|---|
| *H01L 21/44* | (2006.01) |
| *H01L 21/48* | (2006.01) |
| *H01L 21/50* | (2006.01) |
| *H01L 23/498* | (2006.01) |
| *H01L 21/56* | (2006.01) |
| *H01L 23/31* | (2006.01) |
| *H01L 23/367* | (2006.01) |
| *H01L 21/768* | (2006.01) |
| *H01L 23/00* | (2006.01) |

(52) U.S. Cl.
CPC ........ *H01L 23/49827* (2013.01); *H01L 21/486* (2013.01); *H01L 21/4825* (2013.01); *H01L 21/4871* (2013.01); *H01L 21/563* (2013.01); *H01L 21/76895* (2013.01); *H01L 23/3157* (2013.01); *H01L 23/3675* (2013.01); *H01L 23/49811* (2013.01); *H01L 24/17* (2013.01); *H01L 24/81* (2013.01); *H01L 2224/16113* (2013.01); *H01L 2224/16235* (2013.01); *H01L 2924/12042* (2013.01); *H01L 2924/181* (2013.01); *H01L 2924/351* (2013.01)

(58) Field of Classification Search
CPC ............ H01L 23/49827; H01L 21/563; H01L 23/3157; H01L 23/3675; H01L 21/4871; H01L 21/76895; H01L 24/81; H01L 24/17; H01L 23/49811; H01L 21/486; H01L 21/4825
USPC .......................... 438/108, 112, 123, 124, 127
See application file for complete search history.

(56) References Cited

U.S. PATENT DOCUMENTS

| | | | |
|---|---|---|---|
| 8,130,507 B2 * | 3/2012 | Origuchi | ........... H01L 23/49838 174/260 |
| 8,453,323 B2 | 6/2013 | Sakamoto et al. | |

(Continued)

*Primary Examiner* — A. Sefer
*Assistant Examiner* — Dilinh Nguyen
(74) *Attorney, Agent, or Firm* — Pai Patent & Trademark Law Firm; Chao-Chang David Pai

(57) ABSTRACT

A method of making a semiconductor device is characterized by the step of attaching a chip-on-interposer subassembly to a heat spreader with the chip inserted into a cavity of the heat spreader and the interposer laterally extending beyond the cavity. The interposer backside process is executed after the chip-on-interposer attachment and encapsulation to form the finished interposer. The heat spreader provides thermal dissipation, and the finished interposer provides primary fan-out routing for the chip. In the method, a buildup circuitry is electrically coupled to the interposer to provide further fan-out routing.

4 Claims, 10 Drawing Sheets

(56) References Cited

U.S. PATENT DOCUMENTS

| | | |
|---|---|---|
| 8,501,544 B2 | 8/2013 | Pagaila |
| 8,679,963 B2 | 3/2014 | Gulpen et al. |
| 8,735,222 B2 | 5/2014 | Goto et al. |
| 8,742,589 B2 | 6/2014 | Kawabata et al. |
| 2009/0008765 A1* | 1/2009 | Yamano .............. H01L 21/6835 257/690 |
| 2009/0129037 A1* | 5/2009 | Yoshino .............. H01L 23/5389 361/761 |

* cited by examiner

SEMICONDUCTOR DEVICE HAVING CHIP EMBEDDED IN HEAT SPREADER AND ELECTRICALLY CONNECTED TO INTERPOSER AND METHOD OF MANUFACTURING THE SAME

CROSS REFERENCE TO RELATED APPLICATION

This application claims the benefit of filing date of U.S. Provisional Application Ser. No. 61/941,656 filed Feb. 19, 2014. The entirety of said Provisional Application is incorporated herein by reference.

FIELD OF THE INVENTION

The present invention relates to a semiconductor device, and more particularly to a semiconductor device having a chip embedded in a heat spreader and electrically connected to an interposer, and to a method of making the same.

DESCRIPTION OF RELATED ART

The convergence of mobility, communication, and computing has created significant thermal, electrical and reliability challenges to the semiconductor packaging industry. Despite numerous configurations for embedding semiconductor chip in wiring board or mold compound reported in the literature, many manufacturing and performance-related deficiencies remain. For example, U.S. Pat. Nos. 8,742,589, 8,735,222, 8,679,963 and 8,453,323 disclose semiconductor devices that include a semiconductor chip embedded in laminate or mold compound and utilize micro-via for electrical connection of the embedded chip. However, these disclosed devices may render performance degradation problems as the heat generated by the embedded chip can't be dissipated properly through the thermally insulating material such as laminate or mold compound. Additionally, with the advances of chip fabrication technologies, the number of contact pads is steadily increasing and the contact pad spacing (pitch) decreasing accordingly. As a result, the use of the micro-via approach presents a crowding problem which can cause shorting between the neighboring micro-vias.

Another significant drawback arising from the fabrication of the above devices is that the embedded chip may dislocate during encapsulation or lamination. Incomplete metallization of micro-vias due to chip dislocation as described in U.S. Pat. No. 8,501,544 further degrades the quality of the electrical connection, thereby lowering the reliability and production yield of the fabricated device.

For the reasons stated above, and for other reasons stated below, an urgent need exists to develop a new apparatus and method to interconnect embedded chip without using micro-vias at I/O pads to improve chip-level reliability, and avoid the use of thermally insulating material such as mold compound or resin laminate to encapsulate the chips so as to prevent overheating of the chips that creates enormous concerns in device reliability and electrical performance.

SUMMARY OF THE INVENTION

A primary objective of the present invention is to provide a semiconductor device in which a chip-on-interposer subassembly is configured wherein a chip is assembled to an interposer by a plurality of bumps so as to avoid laser or photo-imaging process directly acting on chip I/O pads, thereby improving the production yield and reliability of the semiconductor device.

Another objective of the present invention is to provide a semiconductor device in which an interposer is used to provide fan-out routing for the chip attached thereon. As the chip is electrically connected to one side of the interposer for fan-out through the interposer, a buildup circuitry can be connected to another side of the interposer with much larger contact pad pitch, thereby resolving chip I/O pad crowding problem and improving the production yield and reliability of the semiconductor device.

Yet another objective of the present invention is to provide a semiconductor device in which a chip is enclosed in a cavity of a heat spreader so as to effectively dissipate the heat generated by the chip, thereby improving signal integrity and electrical performance of the semiconductor device.

In accordance with the foregoing and other objectives, the present invention proposes a semiconductor device that includes a chip, an interposer, a heat spreader, an encapsulant and a buildup circuitry. The interposer, interconnected to the chip by bumps, provides primary fan-out routing for the chip so that the possible bond pad disconnection induced by tight I/O pad pitch can be avoided. The heat spreader, having a cavity, is thermally conductible to the chip by a thermally conductive material to provide thermal dissipation for the chip positioned in the cavity. The buildup circuitry, adjacent to the encapsulant and the interposer and electrically connected to the interposer, provides secondary fan-out routing for the chip and has a patterned array of terminal pads that matches the next level assembly wiring board.

In another aspect, the present invention provides a method of making a semiconductor device, including the steps of: providing a chip; providing a semi-finished interposer that includes a substrate having a first surface and an opposite second surface, contact pads on the first surface of the substrate, and metallized vias, each of which is formed in the substrate and has a first end electrically coupled to the contact pads and an opposite second end spaced from the second surface of the substrate; electrically coupling the chip to the contact pads of the semi-finished interposer by a plurality of bumps to form a chip-on-interposer subassembly; providing a heat spreader having a first surface, an opposite second surface, and a cavity formed in the second surface; attaching the chip-on-interposer subassembly to the heat spreader using a thermally conductive material with the chip inserted into the cavity and the semi-finished interposer laterally extending beyond the cavity; providing an encapsulant that covers the second surface of the heat spreader and the semi-finished interposer; removing portions of the encapsulant and the semi-finished interposer to expose the second ends of the metallized vias with the substrate having an exposed second surface substantially coplanar with the second ends of the metallized vias; forming routing traces on the exposed second surface of the substrate to finish fabrication of an interposer that includes the contact pads and the routing traces respectively on opposite first and second surfaces thereof and the metallized vias electrically coupled to the contact pads and the routing traces; and forming a buildup circuitry on the second surface and the routing traces of the interposer and the encapsulant, wherein the buildup circuitry is electrically coupled to the routing traces of the interposer through conductive vias of the buildup circuitry.

Unless specific descriptions or steps necessarily occur in a certain order, the sequence of the above-mentioned steps is not limited to that set forth above and may be changed or reordered according to desired design.

In yet another aspect, the present invention provides a semiconductor device that includes a chip, an interposer, a heat spreader, an encapsulant and a buildup circuitry, wherein (i) the interposer has a first surface, an opposite second surface, contact pads on the first surface, routing traces on the second surface, and metallized vias that electrically couple the contact pads and the routing traces; (ii) the chip is electrically coupled to the contact pads of the interposer by a plurality of bumps to form a chip-on-interposer subassembly; (iii) the heat spreader has a first surface, an opposite second surface, and a cavity formed in the second surface; (iv) the chip-on-interposer subassembly is attached to the heat spreader using a thermally conductive material with the chip inserted into the cavity and the interposer laterally extending beyond the cavity; (v) the encapsulant covers sidewalls of the interposer and the second surface of the heat spreader; and (vi) the buildup circuitry is formed on the second surface and the routing traces of the interposer and the encapsulant and is electrically coupled to the routing traces of the interposer through conductive vias of the buildup circuitry.

The method of making a semiconductor device according to the present invention has numerous advantages. For instance, forming the chip-on-interposer subassembly before attaching it to the heat spreader can ensure the chip is electrically connected so that any contact pad disconnection problem inherent to micro-via process can be avoided. Using the semi-finished interposer to interconnect the chip can avoid the need of creating metallized through vias in the interposer before it is integrated into a 2.5D substrate, thereby resolving through via metal plating problem and improving the production yield. Additionally, as interposer grinding is executed after providing the encapsulant and the heat spreader to support the interposer, it can provide sufficient mechanical rigidity for the ground interposer. Moreover, the two-step forming of the interconnect substrate for the chip is beneficial as the interposer can provide primary fan-out routing whereas the buildup circuitry provide further fan-out routing and horizontal interconnections between the upper and the lower devices.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENT

Hereafter, an example will be provided to illustrate the embodiment of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

FIGS. 1-25 are schematic views showing a method of making a semiconductor device, which includes an interposer, a chip, a heat spreader, an encapsulant and a buildup circuitry in accordance with an embodiment of the present invention.

Figure 25:
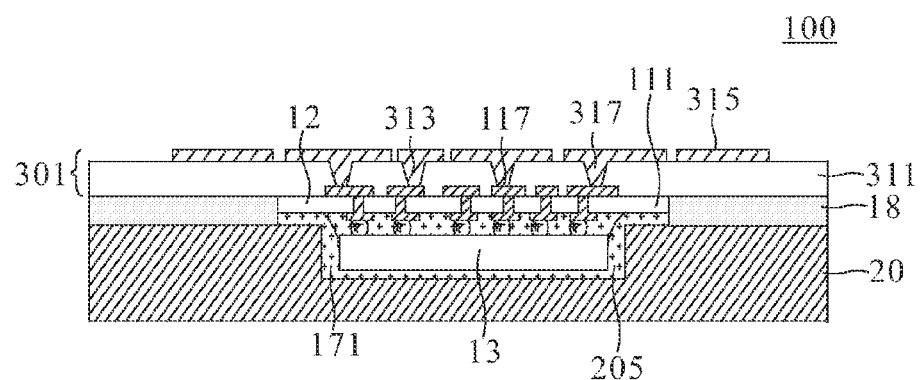
FIG. 25 is a cross-sectional view of a semiconductor device corresponding to a diced unit in FIG. 24 in accordance with an embodiment of the present invention.

As shown in FIG. 25, the semiconductor device 100 includes an interposer 12, a chip 13, a heat spreader 20, an encapsulant 18 and a buildup circuitry 301. The interposer 12 and the chip 13 are attached to the heat spreader 20 using a thermally conductive material 171, with the chip 13 positioned in a cavity 205 of the heat spreader 20. The encapsulant 18 laterally covers and surrounds the sidewalls of the interposer 12 and extends laterally from the interposer 12 to the peripheral edges of the structure. The buildup circuitry 301 covers the interposer 12 and the encapsulant 18 from the upper side and is electrically coupled to routing traces 117 of the interposer 12 through conductive vias 317.

FIGS. 1, 3-4, 6-7 and 9 are cross-sectional views showing a process of fabricating chip-on-interposer subassemblies in accordance with an embodiment of the present invention, and FIGS. 2, 5, 8 and 10 are top perspective views corresponding to FIGS. 1, 4, 7 and 9, respectively.

Figure 1:
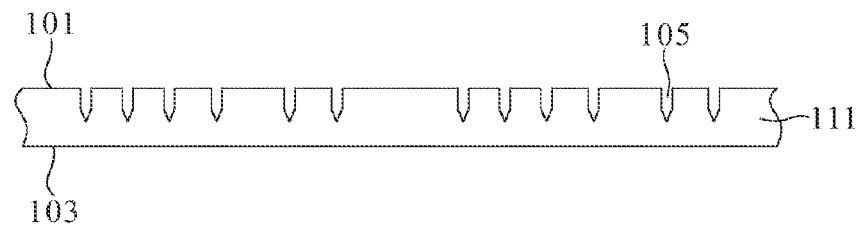
FIGS. 1 and 2 are cross-sectional and top perspective views, respectively, of a substrate having blind vias formed therein in accordance with an embodiment of the present invention.
Figure 2:
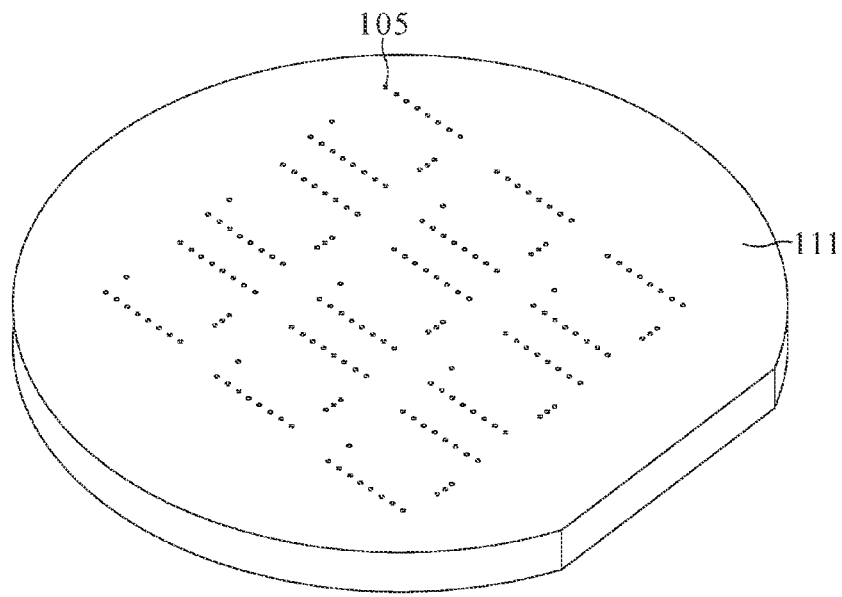

FIGS. 1 and 2 are cross-sectional and top perspective views, respectively, of a substrate 111 having a first surface 101, an opposite second surface 103, and blind vias 105 formed in the first surface 101. The substrate 111 can be made of silicon, glass, ceramic, graphite or resin and have a thickness of 50 microns to 500 microns. The blind vias 105 can have a depth of 25 microns to 250 microns. In this embodiment, the substrate 111 is made of silicon and has a thickness of 200 microns, and the blind vias 105 are formed with a depth of 150 microns.

Figure 3:
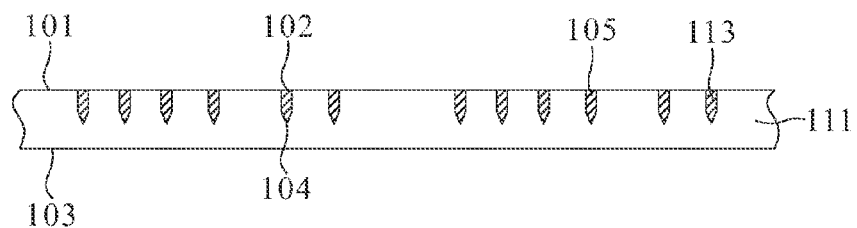
FIG. 3 is a cross-sectional view showing the structure of FIG. 1 is provided with metallized vias in accordance with an embodiment of the present invention.

FIG. 3 is a cross-sectional view of the structure provided with metallized vias 113. The metallized vias 113 are formed in the substrate 111 by metal deposition in the blind vias 105. Each metallized via 113 has a first end 102 substantially coplanar with the first surface 101 of the substrate 111 and an opposite second end 104 spaced from the second surface 103 of the substrate 111. For the aspect of using a silicon or graphite substrate, an insulative/passivation layer such as a silicon oxide layer (not shown in the figures) is needed on the sidewalls of the blind vias 105 before metal deposition as silicon is a semiconductor material and graphite is a conductor material.

Figure 4:
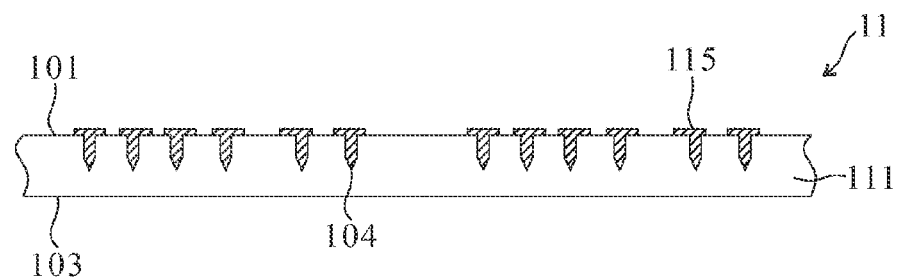
FIGS. 4 and 5 are cross-sectional and top perspective views, respectively, showing the structure of FIG. 3 is provided with routing traces to finish the fabrication of a semi-finished interposer panel in accordance with an embodiment of the present invention.
Figure 5:
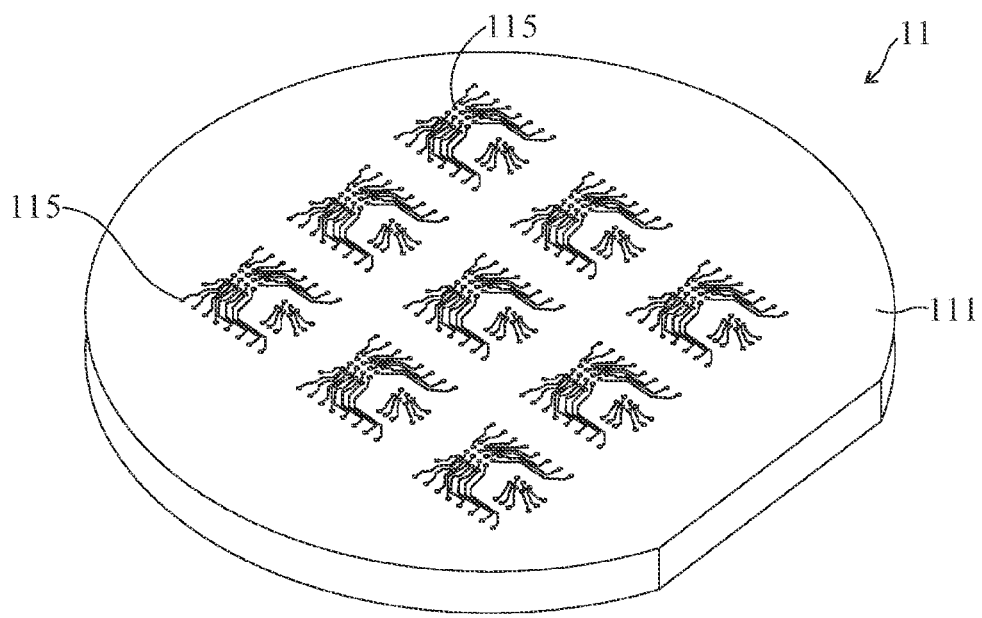

FIGS. 4 and 5 are cross-sectional and top perspective views, respectively, of a semi-finished interposer panel 11 having contact pads 115 on the first surface 101 of the substrate 111. The first surface 101 of the substrate 111 can be metallized by numerous techniques, such as electroplating, electroless plating, evaporating, sputtering, or their combinations. Once the desired thickness is achieved, a metal patterning process is executed to form the contact pads 115 electrically coupled to the first ends 102 of the metallized vias 113. Similarly, for a silicon or graphite substrate, an insulative/passivation layer (not shown in the figures) is needed on the substrate surface before contact pad formation.

Figure 6:
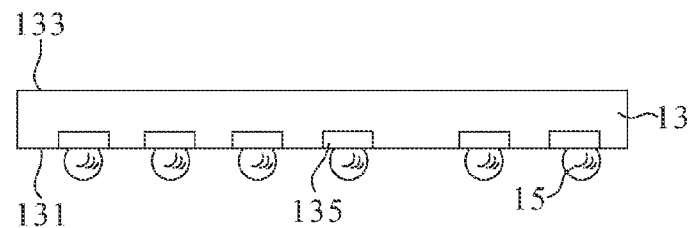
FIG. 6 is a cross-sectional view of a chip with bumps mounted thereon in accordance with an embodiment of the present invention.

FIG. 6 is a cross-sectional view of a chip 13 with bumps 15 mounted thereon. The chip 13 includes an active surface 131, an inactive surface 133 opposite to the active surface 131, and I/O pads 135 on the active surface 131. The bumps 15 are mounted on the I/O pads 135 of the chip 13 and may be solder, gold or copper pillars.

Figure 7:
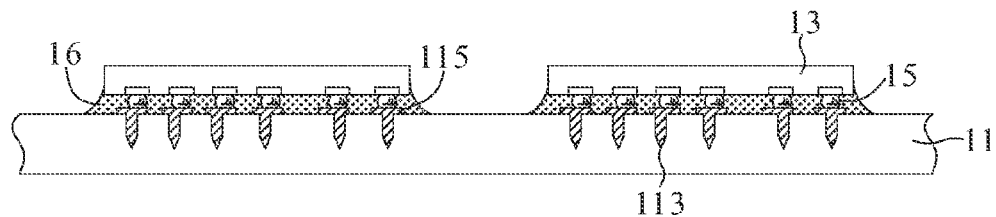
FIGS. 7 and 8 are cross-sectional and top perspective views, respectively, of a panel-scale assembly with the chips of FIG. 6 electrically coupled to the semi-finished interposer panel of FIGS. 4 and 5 in accordance with an embodiment of the present invention.
Figure 8:
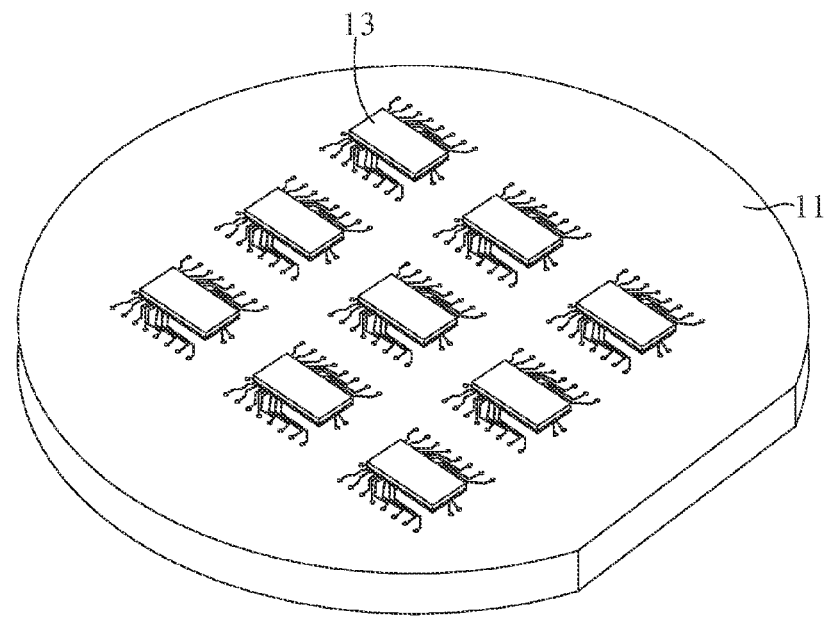

FIGS. 7 and 8 are cross-sectional and top perspective views, respectively, of the panel-scale assembly with the chips 13 electrically coupled to the semi-finished interposer panel 11. The chips 13 can be electrically coupled to the contact pads 115 of the semi-finished interposer panel 11 using the bumps 15 by thermal compression, solder reflow or thermosonic bonding. As an alternative, the bumps 15 may be first deposited on the contact pads 115 of the semi-finished interposer panel 11, and then the chips 13 are electrically coupled to the semi-finished interposer panel 11 by the bumps 15. Optionally, underfill 16 can be further provided to fill the gap between the semi-finished interposer panel 11 and the chips 13.

Figure 9:
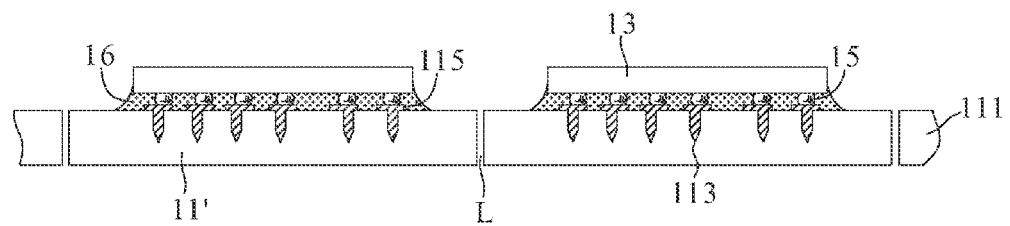
FIGS. 9 and 10 are cross-sectional and top perspective views, respectively, of a diced state of the panel-scale assembly of FIGS. 7 and 8 in accordance with an embodiment of the present invention.
Figure 10:
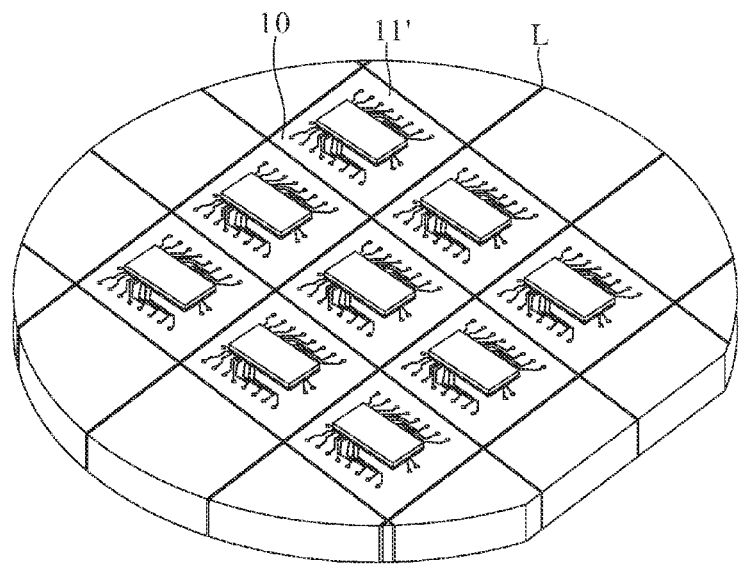

FIGS. 9 and 10 are cross-sectional and top perspective views, respectively, of the panel-scale assembly diced into individual pieces. The panel-scale assembly is singulated into individual chip-on-interposer subassembly 10 along dicing lines "L". Thus, each chip-on-interposer assembly 10 includes a semi-finished interposer 11' singulated from the semi-finished interposer panel 11.

Figure 11:
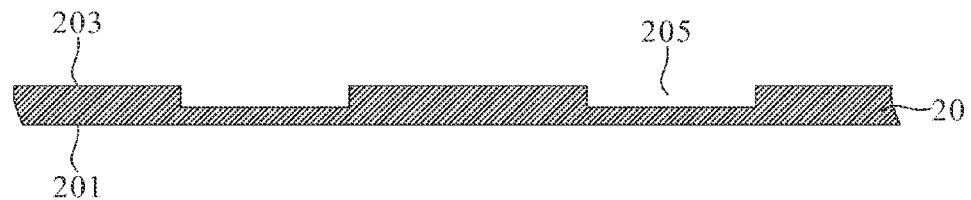
FIGS. 11 and 12 are cross-sectional and top perspective views, respectively, of a heat spreader in accordance with an embodiment of the present invention.
Figure 12:
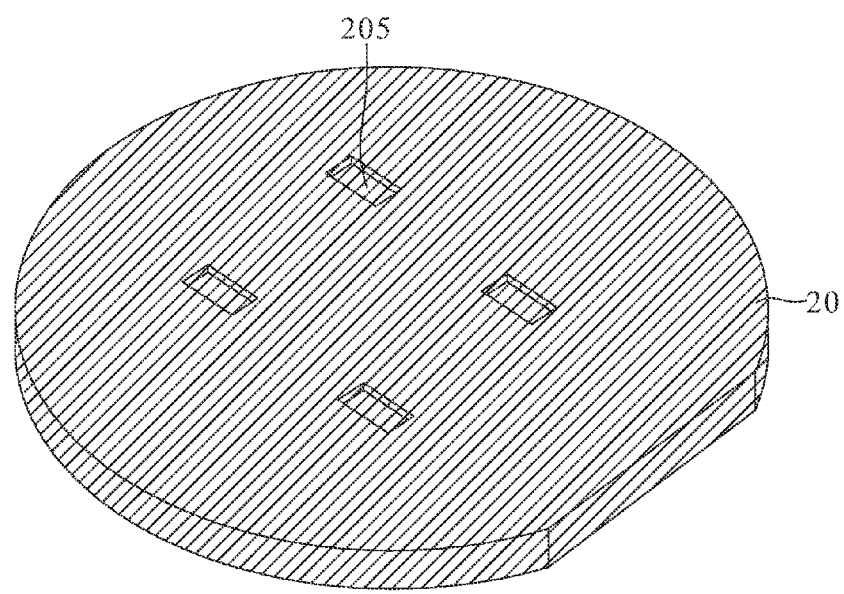

FIGS. 11 and 12 are cross-sectional and top perspective views, respectively, of a heat spreader 20 with a first surface 201, an opposite second surface 203 and cavities 205. The heat spreader 20 can have a thickness of 0.1 mm to 10 mm, and may be made of copper, aluminum, stainless steel or other alloys. The cavities 205 include an entrance at the second surface 203 and each of them can have a different size and cavity depth. The cavity depth can range from 0.05 mm to 1.0 mm. In this embodiment, the heat spreader 20 is a copper sheet having a thickness of 2 mm and is provided with cavities 205 of 0.21 mm in depth (to house the 0.15 mm chip with 0.05 mm conductive bump).

Figure 13:
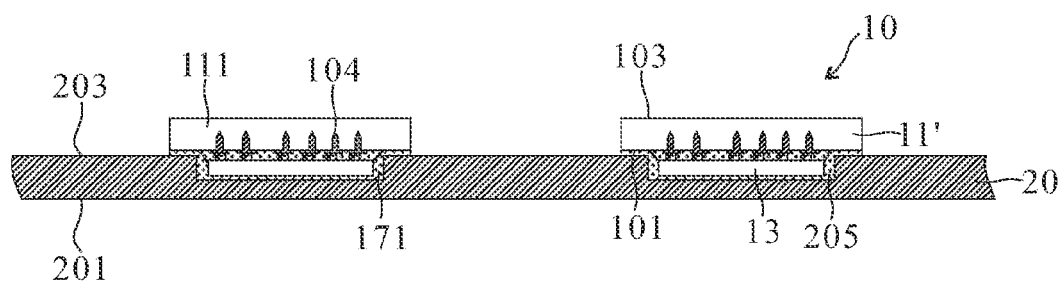
FIGS. 13 and 14 are cross-sectional and top perspective views, respectively, showing chip-on-interposer subassemblies corresponding to individual diced units in FIGS. 9 and 10 are attached to the heat spreader of FIGS. 11 and 12 in accordance with an embodiment of the present invention.
Figure 14:
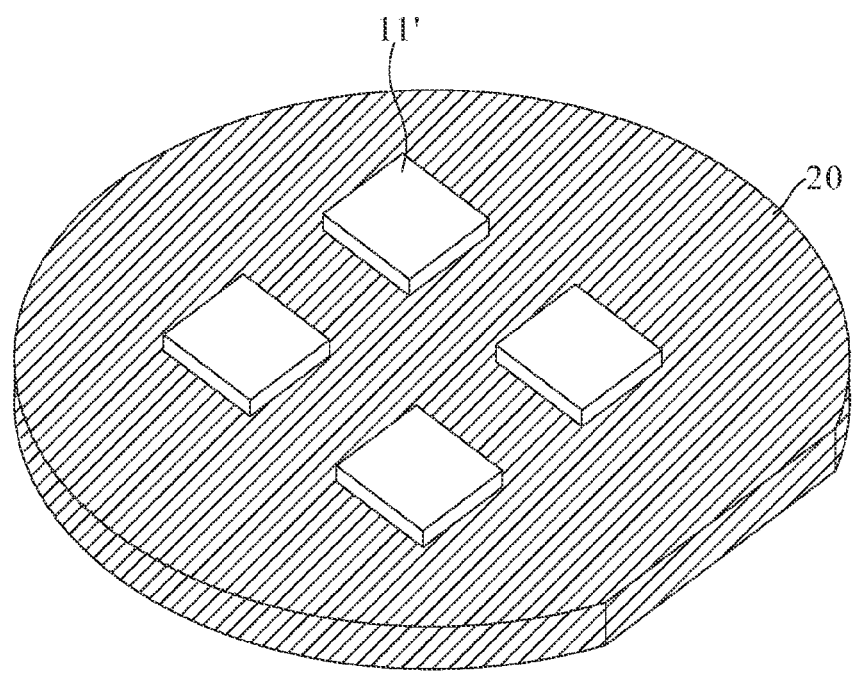

FIGS. 13 and 14 are cross-sectional and top perspective views, respectively, of the chip-on-interposer subassemblies 10 attached to the heat spreader 20 using a thermally conductive material 171. The chips 13 are positioned within the cavities 205, and the semi-finished interposers 11' are located beyond the cavities 205 with the first surface 101 of the substrate 111 attached on the second surface 203 of the heat spreader 20. The chips 13 are attached to the heat spreader 20 by dispensing the thermally conductive material 171 on the cavity bottoms, and then inserting the chips 13 of the chip-on-interposer subassemblies 10 into the cavities 205. The thermally conductive material 171 (typically a thermally conductive but electrically insulating adhesive) within the cavities 205 is compressed by the chips 13, flows upward into the gaps between the chips 13 and the cavity sidewalls, and overflows onto the second surface 203 of the heat spreader 20. As a result, the thermally conductive material 171 surrounds the embedded chips 13, and the squeezed out portion contacts and is sandwiched between the first surface 101 of the semi-finished interposers 11' and the second surface 203 of the heat spreader 20.

Figure 15:
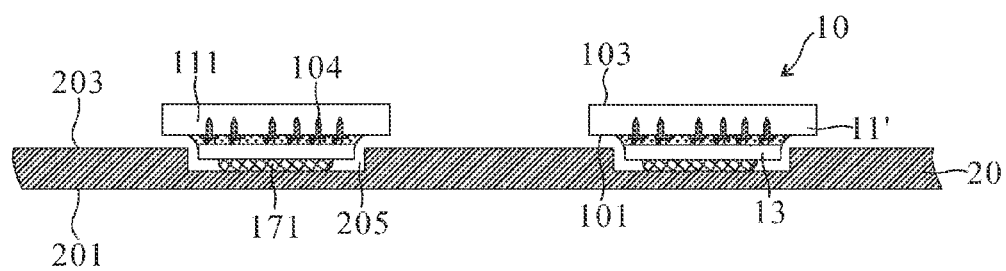
FIG. 15 is a cross-sectional view showing another aspect of attaching chip-on-interposer subassemblies corresponding to individual diced units in FIGS. 9 and 10 to the heat spreader of FIGS. 11 and 12 in accordance with an embodiment of the present invention.
Figure 16:
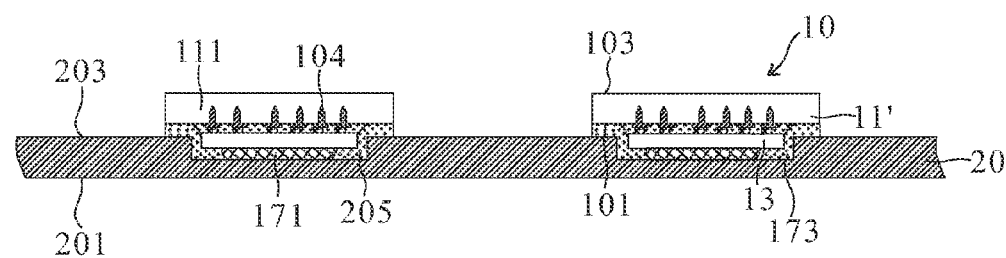
FIG. 16 is a cross-sectional view showing the structure of FIG. 15 is provided with another adhesive in accordance with an embodiment of the present invention.

As another aspect, FIGS. 15 and 16 are cross-sectional views showing an alternative process of attaching the chip-on-interposer subassemblies 10 to the heat spreader 20.

FIG. 15 is a cross-sectional view of the structure of the chip-on-interposer subassemblies 10 attached to the heat spreader 20 using a thermally conductive material 171 dispensed on the bottom of the cavities 205. The thermally conductive material 171 typically is a thermally conductive adhesive and provides mechanical bonds between the chips 13 and the heat spreader 20.

FIG. 16 is a cross-sectional view of the structure provided with an adhesive 173 that fills the space between the semi-finished interposers 11' and the heat spreader 20 and further extends into the cavities 205. The adhesive 173 typically is an electrically insulating underfill and dispensed into the space between the semi-finished interposers 11' and the heat spreader 20 and the remaining spaces within the cavities 205. As a result, the thermally conductive material 171 provides mechanical bonds and thermal connection between the chips 13 and the heat spreader 20, and the adhesive 173 provides mechanical bonds between the chips 13 and the heat spreader 20 and between the semi-finished interposers 11' and the heat spreader 20.

Figure 17:
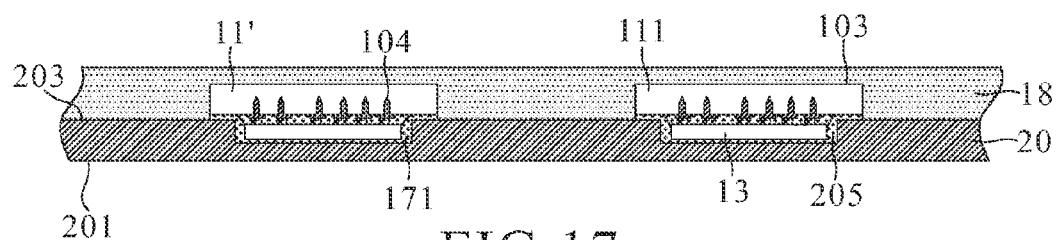
FIG. 17 is a cross-sectional view showing the structure of FIG. 13 is provided with an encapsulant in accordance with an embodiment of the present invention.

FIG. 17 is a cross-sectional view of the structure with an encapsulant 18 deposited on the chip-on-interposer subassemblies 10 and the heat spreader 20. The encapsulant 18 can be provided by molding, resin coating or resin lamination and covers the chip-on-interposer subassemblies 10 and the heat spreader 20 from above.

Figure 18:
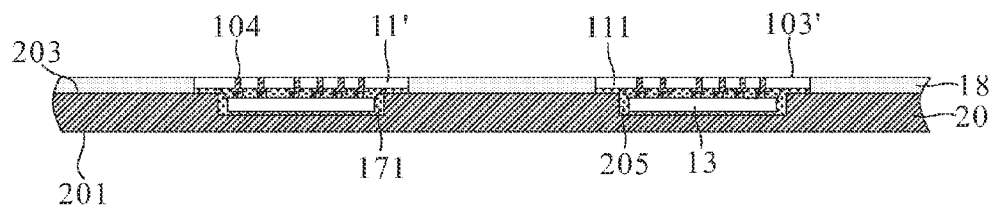
FIG. 18 is a cross-sectional view showing the structure of FIG. 17 is partially removed in accordance with an embodiment of the present invention.

FIG. 18 is a cross-sectional view of the structure with the second ends 104 of the metallized vias 113 exposed from above. Top portions of the encapsulant 18 and the substrate 111 are removed typically by lapping, grinding or laser to expose the second ends 104 of the metallized vias 113 from an exposed second surface 103' of the substrate 111. The exposed second surface 103' of the substrate 111 is substantially coplanar with the second ends 104 of the metallized vias 113 and the top surface of the encapsulant 18.

Figure 19:
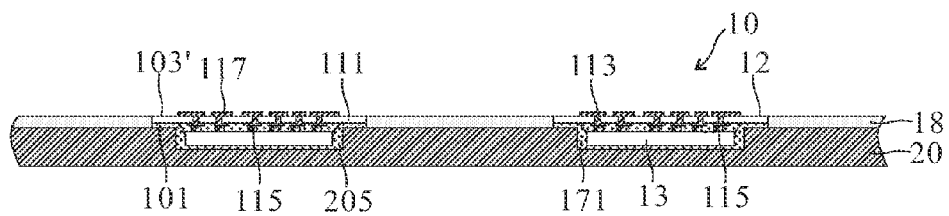
FIGS. 19 and 20 are cross-sectional and top perspective views, respectively, showing the structure of FIG. 18 is provided with routing traces in accordance with an embodiment of the present invention.
Figure 20:
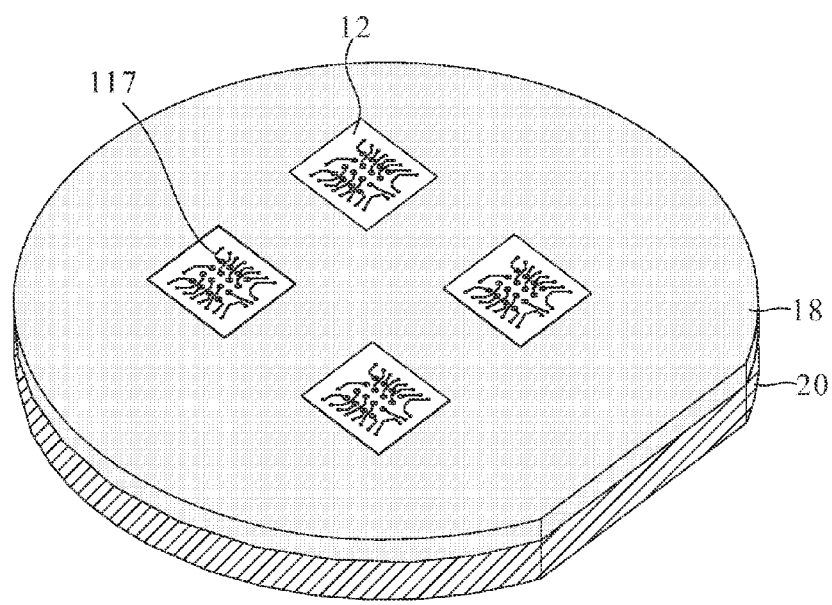

FIGS. 19 and 20 are cross-sectional and top perspective views, respectively, of the structure provided with routing traces 117 by metal deposition and metal patterning process. The second surface 103' of the substrate 111 can be metallized by numerous techniques, such as electroplating, electroless plating, evaporating, sputtering, or their combinations. Once the desired thickness is achieved, a metal patterning process is executed to form the routing traces 117. The routing traces 117 extend laterally on the second surface 103' of the substrate 111 and are electrically coupled to the second ends 104 of the metallized vias 113. The metal patterning techniques include wet etching, electro-chemical etching, laser-assist etching, and their combinations with an etch mask (not shown) thereon that defines the routing traces 117.

At this stage, each chip-on-interposer assembly 10 includes a finished interposer 12 having the contact pads 115 on the first surface 101, the routing traces 117 on the second surface 103', and the metallized vias 113 electrically coupled to the contact pads 115 and the routing traces 117. As the size and pad spacing of the routing traces 117 of the interposer 12 are designed to be larger than those of the chip I/O pads 135, the interposer 12 can provide a primary fan-out routing for the chip 13 so as to ensure a higher manufacturing yield for the next level buildup circuitry interconnection.

Figure 21:
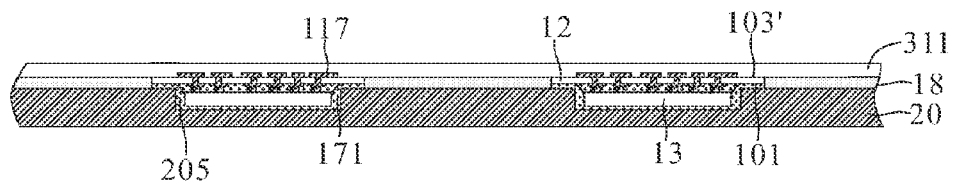
FIG. 21 is a cross-sectional view showing a dielectric layer is disposed on the structure of FIG. 19 in accordance with an embodiment of the present invention.

FIG. 21 is a cross-sectional view of the structure with an insulating layer 311 deposited on the second surface 103' and the routing traces 117 of the interposers 12 and the encapsulant 18 typically by lamination or coating. The insulating layer 311 contacts and covers and extends laterally on the second surface 103' and the routing traces 117 of the interposers 12 and the encapsulant 18 from above, and typically has a thickness of 50 microns. The insulating layer 311 can be made of epoxy resin, glass-epoxy, polyimide, or the like.

Figure 22:
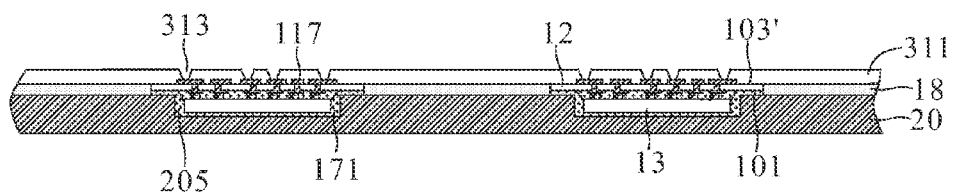
FIG. 22 is a cross-sectional view showing the structure of FIG. 21 is provided with via openings in accordance with an embodiment of the present invention.

FIG. 22 is a cross-sectional view of the structure provided with via openings 313. The via openings 313 extend through the insulating layer 311 and are aligned with selected portions of the routing traces 117. The via openings 313 may be formed by numerous techniques including laser drilling, plasma etching and photolithography, and typically have a diameter of 50 microns. Laser drilling can be enhanced by a pulsed laser. Alternatively, a scanning laser beam with a metal mask can be used.

Figure 23:
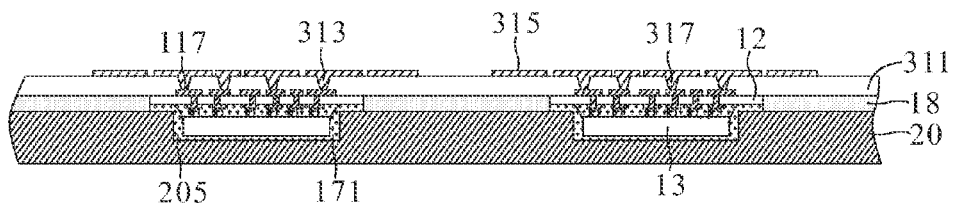
FIG. 23 is a cross-sectional view showing the structure of FIG. 22 is provided with conductive traces in accordance with an embodiment of the present invention.

Referring now to FIG. 23, conductive traces 315 are formed on the insulating layer 311 by metal deposition and metal patterning process. The conductive traces 315 extend from the routing traces 117 of the interposers 12 in the upward direction, fill up the via openings 313 to form conductive vias 317 in direct contact with the routing traces 117 of the interposers 12, and extend laterally on the insulating layer 311. As a result, the conductive traces 315 can provide horizontal signal routing in both the X and Y directions and vertical routing through the via openings 313 and serve as electrical connections for the interposers 12.

The conductive traces 315 can be deposited as a single layer or multiple layers by any of numerous techniques, such as electroplating, electroless plating, evaporating, sputtering, or their combinations. For instance, they can be deposited by first dipping the structure in an activator solution to render the insulating layer 311 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the conductive traces 315 by any of numerous techniques including wet etching, electro-chemical etching, laser-assist etching, and their combinations, with an etch mask (not shown) thereon that defines the conductive traces 315.

Figure 24:
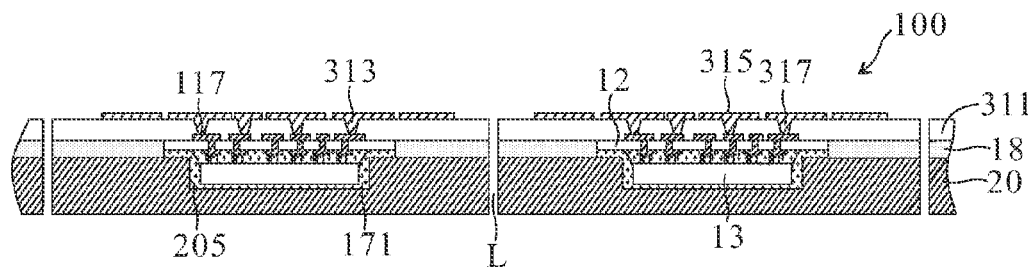
FIG. 24 is a cross-sectional view of a diced state of the structure of FIG. 23 in accordance with an embodiment of the present invention.

FIG. 24 is a cross-sectional view of the structure of FIG. 23 diced into individual pieces. The structure of FIG. 23 is singulated into individual semiconductor device 100 along dicing lines "L".

FIG. 25 is a cross-sectional view of the individual semiconductor device 100. The semiconductor device 100 includes an interposer 12, a chip 13, an encapsulant 18, a heat spreader 20 and a buildup circuitry 301. In this illustration, the buildup circuitry 301 includes an insulating layer 311 and conductive traces 315. The chip 13 is electrically coupled to the interposer 12 by flip chip process and is positioned within the cavity 205 of the heat spreader 20 and is attached to and thermally conductible to the heat spreader 20 through the thermally conductive material 171. The interposer 12 laterally extends beyond the cavity 205 of the heat spreader 20 and is attached to the heat spreader 20 by the squeezed out portion of the thermally conductive material 171 between the first surface 101 of the interposer 12 and the second surface 203 of the heat spreader 20. The encapsulant 18 laterally covers and surrounds and conformally coats the sidewalls of the interposer 12 and is substantially coplanar with the second surface 103' of the substrate 111. The buildup circuitry 301 is electrically coupled to the interposer 12 through the conductive vias 317 in direct contact with the routing traces 117 of the interposer 12, and thus the electrical connection between the interposer 12 and the buildup circuitry 301 is devoid of soldering material.

Figure 26:
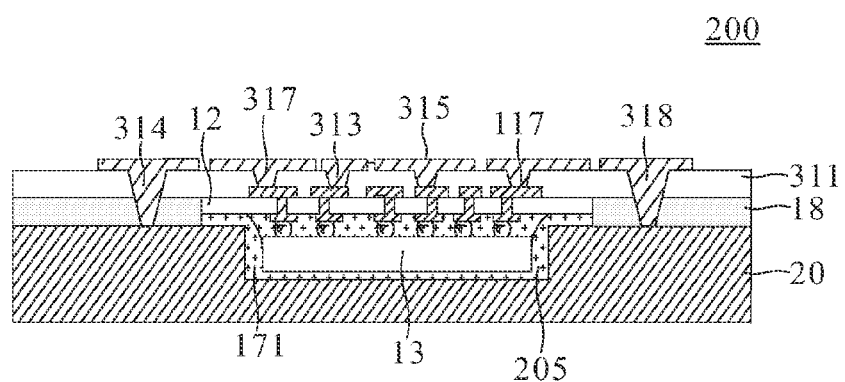
FIG. 26 is a cross-sectional view of another semiconductor device in accordance with an embodiment of the present invention.

FIG. 26 is a cross-sectional view of another aspect of semiconductor device 200. The semiconductor device 200 is similar to the aforementioned semiconductor device 100, except that the buildup circuitry 301 of the semiconductor device 200 further includes additional conductive vias 318 in contact with selected portions of the heat spreader 20. The conductive traces 315 extend from the routing traces 117 of the interposer 12 and selected portions of the heat spreader 20 in the upward direction, fill up the via openings 313, 314 to form conductive vias 317, 318, and extend laterally on the insulating layer 311. As a result, the buildup circuitry 301 is electrically coupled to the routing traces 117 of the interposer 12 through the conductive vias 317 in direct contact with the routing traces 117 of the interposer 12, and is also electrically coupled to the heat spreader 20 through the additional conductive vias 318 in direct contact with the heat spreader 20.

The semiconductor devices described above are merely exemplary. Numerous other embodiments are contemplated.

In addition, the embodiments described above can be mixed-and-matched with one another and with other embodiments depending on design and reliability considerations. The chip can share or not share the cavity with other chips. For instance, a cavity can accommodate a single chip, and the heat spreader can include multiple cavities arranged in an array for multiple chips. Alternatively, numerous chips can be positioned within a single cavity. Likewise, a chip can share or not share the interposer with other chips. For instance, a single chip can be electrically connected to the interposer. Alternatively, numerous chips may be coupled to the same interposer. For instance, four small chips in a 2×2 array can be coupled to the interposer and the interposer can include additional contact pads to receive and route additional chip pads. Also, the buildup circuitry can include additional conductive traces to accommodate additional contact pads of the interposer.

As illustrated in the aforementioned embodiments, a distinctive semiconductor device is configured to exhibit improved thermal performance and reliability, which includes a chip, an interposer, a heat spreader, an encapsulant and a buildup circuitry.

The chip is electrically coupled to an interposer by a plurality of bumps and to form a chip-on-interposer subassembly. The chip can be a packaged or unpackaged chip. For instance, the chip can be a bare chip, or a wafer level packaged die, etc.

The heat spreader can extend to the peripheral edges of the semiconductor device to provide mechanical support for the chip, the interposer and the buildup circuitry. In a preferred embodiment, the heat spreader includes a metal plate and a cavity extending into the metal plate. The metal plate can provide essential thermal dissipation for the embedded chip and have a thickness of 0.1 mm to 10 mm. The material of the metal plate can be selected for the thermal dissipation consideration, and include copper, aluminum, stainless steel or other alloys. As such, the heat from the chip can be dissipated through the metal plate that provides a thermal contact surface.

The cavity of the heat spreader can have a larger diameter or dimension at its entrance than at its bottom and a depth of 0.05 mm to 1.0 mm. For instance, the cavity can have a cut-off conical or pyramidal shape in which its diameter or dimension increases as it extends from its bottom to its entrance. Alternatively, the cavity can have a cylindrical shape with a constant diameter. The cavity can also have a circular, square or rectangular periphery at its entrance and its bottom.

The attachment of the chip-on-interposer subassembly to the heat spreader can be implemented by a thermally conductive material (such as thermally conductive adhesive) that is first dispensed on the cavity bottom and then squeezed partially out of the cavity when inserting the chip into the cavity of the heat spreader. The thermally conductive material can contact and surround the embedded chip within the cavity of the heat spreader. The squeezed out portion can contact and be sandwiched between the first surface of the interposer and the second surface of the heat spreader that laterally extends from the cavity entrance. Alternatively, a thermally conductive material (such as thermally conductive adhesive) can be dispensed on the cavity bottom and be contained within the cavity when inserting the chip into the cavity. A second adhesive (typically an electrically insulating underfill) can then be dispensed and filled into the remaining space within the cavity and extends to the space between the first surface of the interposer and the second surface of the heat spreader that laterally extends from the cavity entrance. Accordingly, the thermally conductive material provides mechanical bonds and thermal connection between the chip and the heat spreader while the second adhesive provides mechanical bonds between the interposer and the heat spreader.

The interposer laterally extends beyond the cavity and can be attached to the heat spreader with its first surface attached to the second surface of the heat spreader. The interposer can be made of a silicon, glass, ceramic, graphite or resin material and is semi-finished when it is electrically coupled to the chip and attached to the heat spreader. In a preferred embodiment, the semi-finished interposer includes a substrate with a thickness of 50 to 500 micron, metallized vias with a depth of 25 to 250 microns, and contact pads that match the chip I/O pads. After interposer backside process including grinding and circuitry formation, the interposer can contain a pattern of traces that fan out from a finer pitch at its first surface to a coarser pitch at its second surface. Accordingly, the interposer can provide first level fan-out routing/interconnection for the chip. Additionally, as the interposer is typically made of a high elastic modulus material with CTE (coefficient of thermal expansion) approximately equal to that of the chip (for example, 3 to 10 ppm per degree Centigrade), internal stresses in chip and its electrical interconnection caused by CTE mismatch can be largely compensated or reduced. For the convenience of following description, the direction in which the first surface of the interposer faces is defined as the first vertical direction, and the direction in which the second surface of the interposer faces is defined as the second vertical direction.

The encapsulant can be deposited on the interposer and the heat spreader by molding, resin coating or resin lamination after the chip-on-interposer attachment, and then be partially removed typically by lapping, grinding or laser to be substantially coplanar with the exposed second surface of the interposer substrate. As a result, the encapsulant can cover and contact the second surface of the heat spreader from the second vertical direction, and laterally cover and surround and conformally coat the sidewalls of the interposer and extends laterally from the interposer to the peripheral edges of the device.

The buildup circuitry covers the second surface and the routing traces of the interposer and the encapsulant in the second vertical direction and can provide secondary fan-out routing/interconnection. Besides, the buildup circuitry can further be electrically coupled to the metallic second surface of the heat spreader by additional conductive vias for ground connection. The buildup circuitry includes an insulating layer and one or more conductive traces. The insulating layer is deposited on the second surface and the routing traces of the interposer and the encapsulant. The conductive traces extend laterally on the insulating layer and extend through via openings in the insulating layer to form conductive vias in direct contact with the contact pads of the interposer and optionally with the heat spreader. Accordingly, the conductive traces can directly contact the contact pads to provide signal routing for the interposer, and thus the electrical connection between the interposer and the buildup circuitry can be devoid of soldering material. Further, the buildup circuitry may include additional insulating layers, additional via openings, and additional conductive traces if needed for further signal routing. The outmost conductive traces of the buildup circuitry can accommodate conductive joints, such as solder balls, for electrical communication and mechanical attachment with the next level assembly or another electronic device such as a semiconductor chip, a plastic package or another semiconductor device.

The term "cover" refers to incomplete or complete coverage in a vertical and/or lateral direction. For instance, in the cavity-down position, the heat spreader covers the chip in the upward direction regardless of whether another element such as the thermally conductive material is between the heat spreader and the chip, and the buildup circuitry also covers the heat spreader in the downward direction regardless of what's in between.

The phrases "electrical connection", "electrically connected", "electrically coupled" and "electrically couples" refer to direct and indirect electrical connection. For instance, the conductive traces directly contact and are electrically connected to the routing traces of the interposer, and are spaced from and electrically connected to the contact pads of the interposer by the routing traces and the metallized vias.

The "first vertical direction" and "second vertical direction" do not depend on the orientation of the device, as will be readily apparent to those skilled in the art. For instance, the first surface of the interposer faces the first vertical direction and the second surface of the interposer faces the second vertical direction regardless of whether the device is inverted. Thus, the first and second vertical directions are opposite one another and orthogonal to the lateral directions. Furthermore, the first vertical direction is the upward direction and the second vertical direction is the downward direction in the cavity-down position, and the first vertical direction is the downward direction and the second vertical direction is the upward direction in the cavity-up position.

The semiconductor device according to the present invention has numerous advantages. For instance, the chip is electrically coupled to the interposer by a well-known flip chip bonding process such as thermo-compression or solder reflow, which can avoid the positional accuracy issue inherent in most conventional approaches where an adhesive carrier is used for temporary bonding. The interposer provides a first level fan-out routing/interconnection for the chip whereas the buildup circuitry provides a second level fan-out routing/interconnection. As the buildup circuitry is formed on the interposer designed with larger pad size and pitch space, the manufacturing yield is greatly improved compared to the conventional types where buildup circuitry is directly formed on the chip I/O pad without fan-out routing. The heat spreader can provide thermal dissipation, electromagnetic shielding and moisture barrier for the embedded chip, and also provides mechanical support for the chip, the interposer and the buildup circuitry. The direct electrical connection without solder between the interposer and the buildup circuitry is advantageous to high I/O and high performance. The device made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and the description may simplify or omit elements or steps well-known to those skilled in the art to prevent obscuring the present invention. Likewise, the drawings may omit duplicative or unnecessary elements and reference labels to improve clarity.

What is claimed is:

1. A method of making a semiconductor device, comprising the steps of:
   providing a chip;
   providing a semi-finished interposer that includes a substrate having a first surface and an opposite second surface, contact pads on the first surface of the substrate, and metallized vias, each of which is formed in the substrate and has a first end electrically coupled to the contact pads and an opposite second end spaced from the second surface of the substrate;
   electrically coupling the chip to the contact pads of the semi-finished interposer by a plurality of bumps to form a chip-on-interposer subassembly;
   providing a heat spreader having a first surface, an opposite second surface, and a cavity formed in the second surface;
   attaching the chip-on-interposer subassembly to the heat spreader using a thermally conductive material with the chip inserted into the cavity and the semi-finished interposer laterally extending beyond the cavity;
   providing an encapsulant that covers the second surface of the heat spreader and the semi-finished interposer;
   removing portions of the encapsulant and the semi-finished interposer to expose the second ends of the metallized vias with the substrate having an exposed second surface substantially coplanar with the second ends of the metallized vias;
   forming routing traces on the exposed second surface of the substrate to finish fabrication of an interposer that includes the contact pads and the routing traces respectively on opposite first and second surfaces thereof and the metallized vias electrically coupled to the contact pads and the routing traces; and
   forming a buildup circuitry on the second surface and the routing traces of the interposer and the encapsulant, wherein the buildup circuitry is electrically coupled to the routing traces of the interposer through conductive vias of the buildup circuitry.

2. The method of claim 1, wherein the step of electrically coupling the chip to the contact pads of the semi-finished interposer is performed on a panel scale, and a singulation step is executed to separate individual chip-on-interposer subassemblies before the step of attaching the chip-on-interposer subassembly to the heat spreader.

3. The method of claim 1, wherein the buildup circuitry comprises additional conductive vias for electrically coupling to the heat spreader.

4. A semiconductor device prepared by a method that comprises steps of:
   providing a chip;
   providing a semi-finished interposer that includes a substrate having a first surface and an opposite second surface, contact pads on the first surface of the substrate, and metallized vias, each of which is formed in the substrate and has a first end electrically coupled to the contact pads and an opposite second end spaced from the second surface of the substrate;
   electrically coupling the chip to the contact pads of the semi-finished interposer by a plurality of bumps to form a chip-on-interposer subassembly;
   providing a heat spreader having a first surface, an opposite second surface, and a cavity formed in the second surface;
   attaching the chip-on-interposer subassembly to the heat spreader using a thermally conductive material with the chip inserted into the cavity and the semi-finished interposer laterally extending beyond the cavity;
   providing an encapsulant that covers the second surface of the heat spreader and the semi-finished interposer;
   removing portions of the encapsulant and the semi-finished interposer to expose the second ends of the metallized vias with the substrate having an exposed second surface substantially coplanar with the second ends of the metallized vias;

forming routing traces on the exposed second surface of the substrate to finish fabrication of an interposer that includes the contact pads and the routing traces respectively on opposite first and second surfaces thereof and the metallized vias electrically coupled to the contact pads and the routing traces; and forming a buildup circuitry on the second surface and the routing traces of the interposer and the encapsulant, wherein the buildup circuitry is electrically coupled to the routing traces of the interposer through conductive vias of the buildup circuitry.

* * * * *